(12) United States Patent
Olson et al.

(10) Patent No.: US 7,459,704 B2
(45) Date of Patent: Dec. 2, 2008

(54) ION SOURCE CONFIGURATION FOR PRODUCTION OF IONIZED CLUSTERS, IONIZED MOLECULES AND IONIZED MONO-ATOMS

(75) Inventors: Joseph C. Olson, Beverly, MA (US); Anthony Renau, West Newbury, MA (US); Donna L. Smatlak, Belmont, MA (US); Kurt Deckerlucke, Essex, MA (US); Paul Murphy, Reading, MA (US); Alexander S. Perel, Danvers, MA (US); Russell J. Low, Rowley, MA (US); Peter Kurunczi, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 590 days.

(21) Appl. No.: 11/269,033

(22) Filed: Nov. 8, 2005

(65) Prior Publication Data

US 2006/0169915 A1    Aug. 3, 2006

Related U.S. Application Data

(60) Provisional application No. 60/627,202, filed on Nov. 12, 2004.

(51) Int. Cl.
*G21K 5/10* (2006.01)
*H01J 37/08* (2006.01)

(52) U.S. Cl. .................. 250/492.21; 250/427; 250/307; 250/310; 250/300; 250/251; 250/423 R; 250/492.3; 250/425; 250/426; 250/289; 250/492.2; 438/300; 438/61; 438/513; 438/528; 257/E21.345; 257/E21.607; 257/E21.143; 257/E21.433; 315/111.81; 315/231.31; 315/111.21; 313/230; 313/359.1; 313/363.1; 376/144

(58) Field of Classification Search ............ 250/492.21, 250/427, 307, 310, 300, 251, 423 R, 492.3, 250/425, 426, 289, 492.2; 438/300, 61, 513, 438/528; 257/E21.345, E21.607, E21.143, 257/E21.433; 315/111.81, 231.31, 111.21; 313/230, 359.1, 363.1; 376/144
See application file for complete search history.

(56) References Cited

U.S. PATENT DOCUMENTS 6,452,338 B1 * 9/2002 Horsky .................. 315/111.81

* cited by examiner

*Primary Examiner*—Jack I Berman
*Assistant Examiner*—Meenakshi S Sahu

(57) ABSTRACT

Ion sources and methods for generating molecular ions in a cold operating mode and for generating atomic ions in a hot operating mode are provided. In some embodiments, first and second electron sources are located at opposite ends of an arc chamber. The first electron source is energized in the cold operating mode, and the second electron source is energized in the hot operating mode. In other embodiments, electrons are directed through a hole in a cathode in the cold operating mode and are directed at the cathode in the hot operating mode. In further embodiments, an ion beam generator includes a molecular ion source, an atomic ion source and a switching element to select the output of one of the ion sources.

36 Claims, 5 Drawing Sheets

ION SOURCE CONFIGURATION FOR PRODUCTION OF IONIZED CLUSTERS, IONIZED MOLECULES AND IONIZED MONO-ATOMS

CROSS-REFERENCE TO RELATED APPLICATION

This application claims priority based on provisional application Ser. No. 60/627,202, filed Nov. 12, 2004, which is hereby incorporated by reference in its entirety.

FIELD OF THE INVENTION

This invention relates to ion sources that are suitable for use in ion implanters and, more particularly, to ion source configurations that can generate ionized clusters, ionized molecules and ionized mono-atoms in different applications.

BACKGROUND OF THE INVENTION

An ion source is a critical component of an ion implanter. The ion source generates an ion beam which passes through the beamline of the ion implanter and is delivered to a semiconductor wafer. The ion source is required to generate a stable, well-defined beam for a variety of different ion species and extraction voltages. In a semiconductor production facility, the ion implanter, including the ion source, is required to operate for extended periods without the need for maintenance or repair.

Ion implanters have conventionally used ion sources with directly heated cathodes, wherein a filament for emitting electrons is mounted in the arc chamber of the ion source and is exposed to the highly corrosive plasma in the arc chamber. Such directly heated cathodes typically include a relatively small diameter wire filament and therefore degrade or fail in the corrosive environment of the arc chamber in a relatively short time. Indirectly heated cathode ion sources have been developed in order to improve ion source lifetimes. An indirectly heated cathode includes a relatively massive cathode which is heated by electron bombardment from a filament and emits electrons thermionically. The filament is isolated from the plasma in the arc chamber and thus has a long lifetime. The relatively massive structure of the cathode ensures operation over an extended period.

Notwithstanding such improvements, ion sources may not provide satisfactory performance under certain operating conditions. State of the art semiconductor devices require extremely shallow junction depths which are obtained with low implant energies. However, ion implanters are typically designed for efficient operation at relatively high implant energies and may not function efficiently at the energies required for shallow junction implantation. At low implant energies, the current delivered to the wafer is much lower than desired and in some cases may be near zero. As a result, extremely long implant times are required to achieve a specified dose, and throughput is adversely effected. A small ion current may be delivered to the wafer because the ion source operates inefficiently at low extraction voltages. In addition, the ion beam expands as it is transported through the beamline of the ion implanter, and ions may strike components of the ion implanter along the beamline rather than the target semiconductor wafer.

Low energy productivity can be significantly improved by running heavier molecules or clusters of atoms. Conventional hot cathode ion sources produce a high output of mono-atoms but tend to break up clusters and molecules, thereby reducing the productivity improvement. An ion source that produces molecules and clusters is disclosed in U.S. Pat. No. 6,452,338 issued Sep. 17, 2002 to Horsky. The disclosed ion source relies on a beam of electrons to ionize molecules and clusters without causing them to break up. The patent describes the range of electron energies as 20-1200 eV, where the highest energies are used to completely break up the molecules and produce multiply charged ions. Extraction currents are limited with this source due to the lack of a plasma within the source.

Semiconductor manufacturers prefer that ion implanters operate over a wide range of implant parameters in order to reduce the need for multiple ion implanters. More specifically, ion implanters should have acceptable performance over a wide range of ion energies, including very low energies to achieve shallow junction depths. Prior art ion sources have had limited operating ranges. Accordingly, there is a need for improved ion sources and methods of generating ions.

SUMMARY OF THE INVENTION

According to a first aspect of the invention, an ion source is provided. The ion source comprises an arc chamber housing defining an arc chamber, a first dopant source configured to supply a first dopant material to the arc chamber in a first operating mode, a first electron source configured to ionize the first dopant material in the first operating mode, a second dopant source configured to supply a second dopant material to the arc chamber in a second operating mode, and a second electron source configured to ionize the second dopant material in the second operating mode, wherein the ion source supplies ions of the first dopant material in the first operating mode and supplies ions of the second dopant material in the second operating mode.

The first electron source may be configured to ionize the first dopant material at relatively low temperature in the first operating mode, and the second electron source may be configured to ionize the second dopant material at relatively high temperature in the second operating mode. The first dopant source may be configured to supply molecules of the first dopant material to the arc chamber in the first operating mode.

According to a second aspect of the invention, a method is provided for generating ions in an arc chamber. The method comprises supplying a first dopant material to the arc chamber in a first operating mode, ionizing the first dopant material in the first operating mode using a first electron source, supplying a second dopant material to the arc chamber in a second operating mode, and ionizing the second dopant material in the second operating mode using a second electron source, wherein the ion source supplies ions of the first dopant material in the first operating mode and supplies ions of the second dopant material in the second operating mode.

According to a third aspect of the invention, an ion source comprises an arc chamber housing defining an arc chamber; a first dopant source configured to supply a first dopant material to the arc chamber in a first operating mode; a second dopant source configured to supply a second dopant material to the arc chamber in a second operating mode; and an electron source including a cathode positioned in the arc chamber, a filament configured to generate electrons when energized with an electrical current and a control element configured to direct the electrons into the arc chamber in the first operating mode and to direct the electrons to the cathode for heating thereof in the second operating mode.

According to a fourth aspect of the invention, a method is provided for generating ions in an arc chamber. The method comprises supplying a first dopant material to the arc chamber in a first operating mode; supplying a second dopant material to the arc chamber in a second operating mode; ionizing the first dopant material in the first operating mode by directing electrons into the arc chamber; and ionizing the second dopant material in the second operating mode by directing the electrons to a cathode positioned in the arc chamber, for heating of the cathode.

According to a fifth aspect of the invention, an ion source comprises a molecular ion source configured to generate molecular ions in a first operating mode; an atomic ion source configured to generate atomic ions in a second operating mode; and a switching element configured to direct molecular ions from the molecular ion source along a beamline in the first operating mode and configured to direct atomic ions from the atomic ion source along the beamline in the second operating mode.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
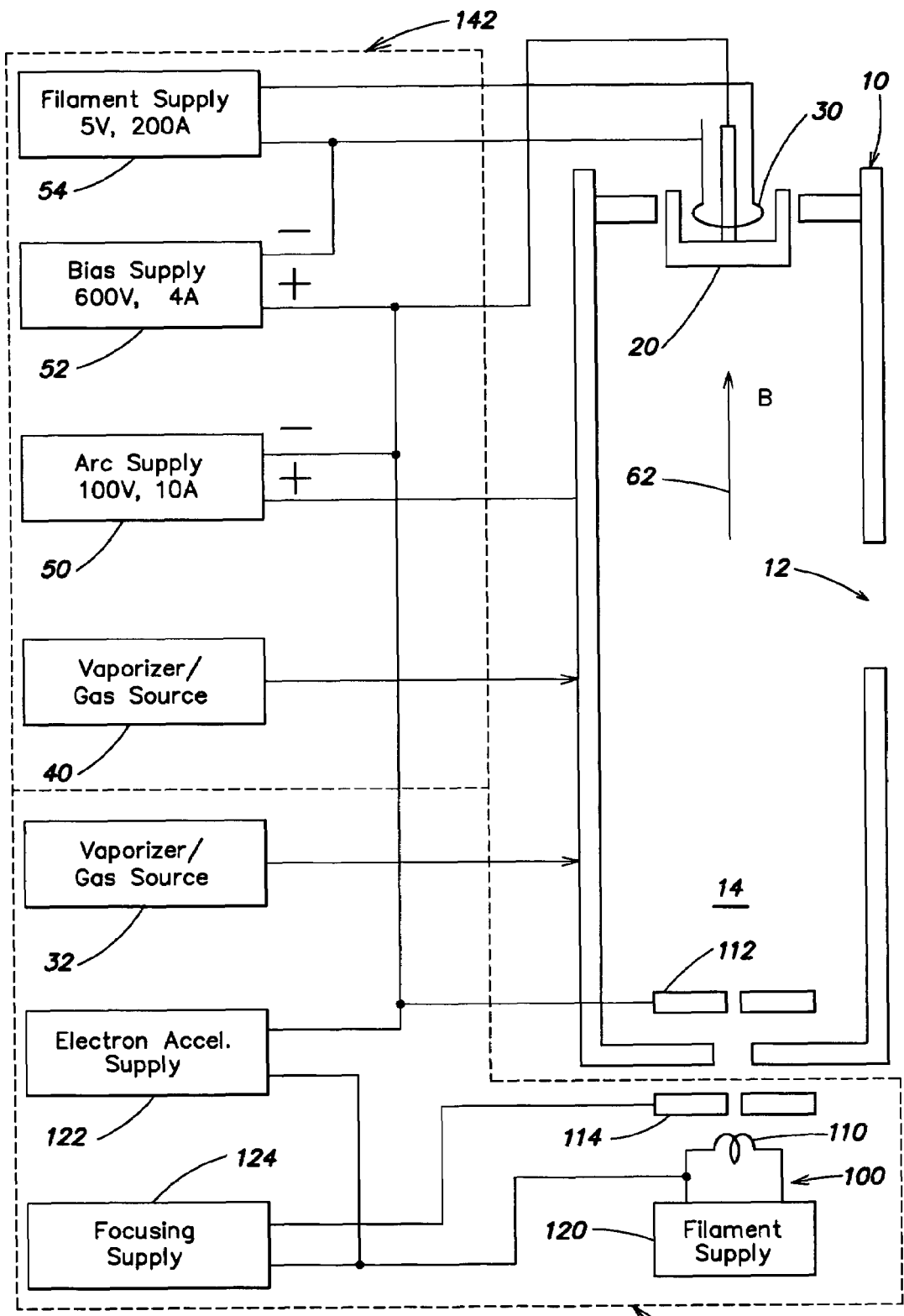
FIG. 1 is a schematic block diagram of an ion source in accordance with a first embodiment of the invention.

An ion source in accordance with a first embodiment of the invention is shown in FIG. 1. The ion source has a cold operating mode for generation of ionized molecules and ionized clusters, and a hot operating mode for generation of ionized mono-atoms and other conventional species. The hot operating mode involves the generation of a plasma, whereas the cold operating mode avoids the generation of a plasma.

An arc chamber housing 10 having an extraction aperture 12 defines an arc chamber 14. A cathode 20 is positioned within arc chamber 14 at one end. A filament 30, positioned outside arc chamber 14 in close proximity to cathode 20, produces heating of cathode 20 in the hot operating mode. Cathode 20 is configured as an indirectly heated cathode. Cathode 20 and filament 30 function as an electron source in the hot operating mode. A material to be ionized in the hot operating mode is supplied from a vaporizer/gas source 40 to arc chamber 14.

An arc power supply 50 has a positive terminal connected to arc chamber housing 10 and a negative terminal connected to cathode 20. The arc power supply 50 accelerates electrons emitted by cathode 20 into the plasma in arc chamber 14.

A bias power supply 52 has a positive terminal connected to cathode 20 and a negative terminal connected to filament 30. The bias power supply 52 accelerates electrons emitted by filament 30 to cathode 20 to produce heating of cathode 20 in the hot operating mode.

A filament power supply 54 has output terminals connected to filament 30. The filament power supply 54 produces heating of filament 30, which in turn generates electrons that are accelerated toward cathode 20 for heating of cathode 20.

A source magnet (not shown) produces a magnetic field B within arc chamber 14 in a direction indicated by arrow 62. Typically, the source magnet includes poles at opposite ends of arc chamber 14. The source magnet is connected to a magnet power supply (not shown). The magnetic field produces increased interaction between electrons emitted by cathode 20 and the plasma in arc chamber 14 in the hot operating mode. The source magnet is de-energized in the cold operating mode.

An electron source 100 for operation in the cold operating mode is located at the opposite end of arc chamber 14 from cathode 20. Electron source 100 includes a filament 110 located outside arc chamber 14, an acceleration electrode 112 located within arc chamber 14 and a focusing electrode 114. Filament 110 is connected to a filament power supply 120 for heating of filament 110. An acceleration power supply 122 is connected between acceleration electrode 112 and filament 110 for acceleration of the electrons generated by filament 110 into an electron beam. A focusing power supply 124 is connected between focusing electrode 114 and filament 110 to focus the electrons through an opening in arc chamber housing 10 into arc chamber 14. Acceleration power supply 122 may accelerate the electrons generated by filament 110 to energies in the range of about 20-1000 electron volts. A material to be ionized in the cold operating mode is supplied from a vaporizer/gas source 32 to arc chamber 14.

The ion source shown in FIG. 1 provides an efficient arrangement for allowing an ion source to operate in two modes: a cold operating mode where gentle ionization and preservation of molecules and clusters is the object, and a hot operating mode where the formation of a plasma and full breakup and ionization of the contents of the source is the goal. This arrangement allows the source to maintain high productivity across the full performance envelope of the implanter, not just at high or low energy. The basic concept is to place a source of electrons at each end of the arc chamber. One electron source may include an indirectly heated cathode which serves as the electron source in the hot operating mode. The other electron source includes the source of electrons for soft ionization of the molecules fed to the arc chamber in the cold operating mode. Additional details regarding an electron source for operation in the cold mode are disclosed in U.S. Pat. No. 6,452,338 issued Sep. 17, 2002 to Horsky. The electron source not in use at any time may be biased to act as a repeller to improve electron lifetime within the ion source. Thus, in the hot mode, the components of electron source 100 may be biased to act as an electron repeller, and in the cold mode, cathode 20 may be biased to act as an electron repeller.

Referring to FIG. 1, cold mode components 140 include vaporizer/gas source 32, accelerating power supply 122, focusing power supply 124, filament power supply 120, filament 110 and focusing electrode 114. Hot mode components 142 include vaporizer/gas source 40, arc power supply 50, bias power supply 52 and filament power 54. The arc chamber housing 10 and related components operate in the cold mode and the hot mode. The hot mode components 142 are de-energized, inhibited and/or disconnected when the ion source operates in the cold mode. Conversely, the cold mode components 140 are de-energized, inhibited and/or disconnected when the ion source operates in the hot mode.

Figure 3:
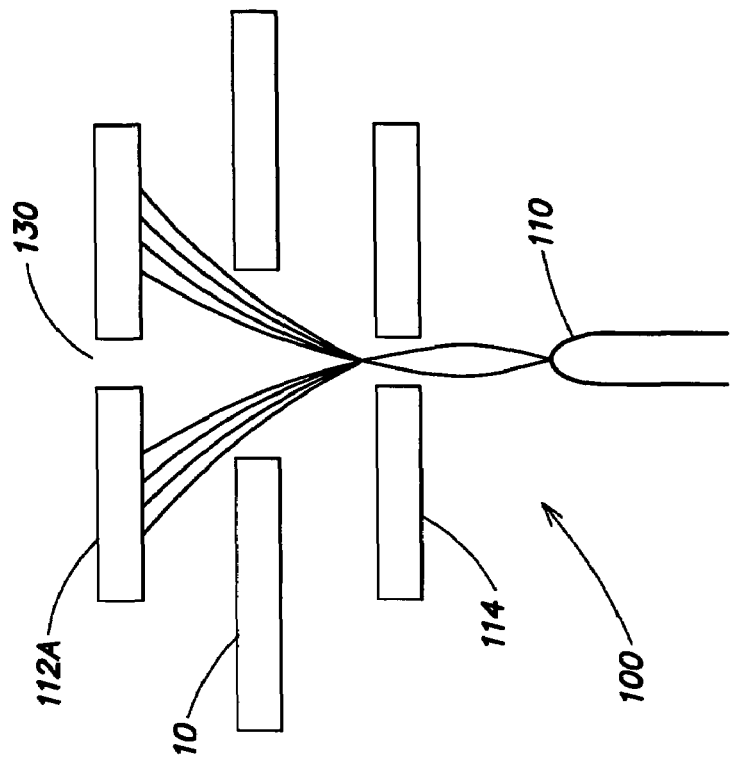
FIG. 3 is a schematic block diagram of the electron source of FIG. 2, shown in a hot operating mode.
Figure 2:
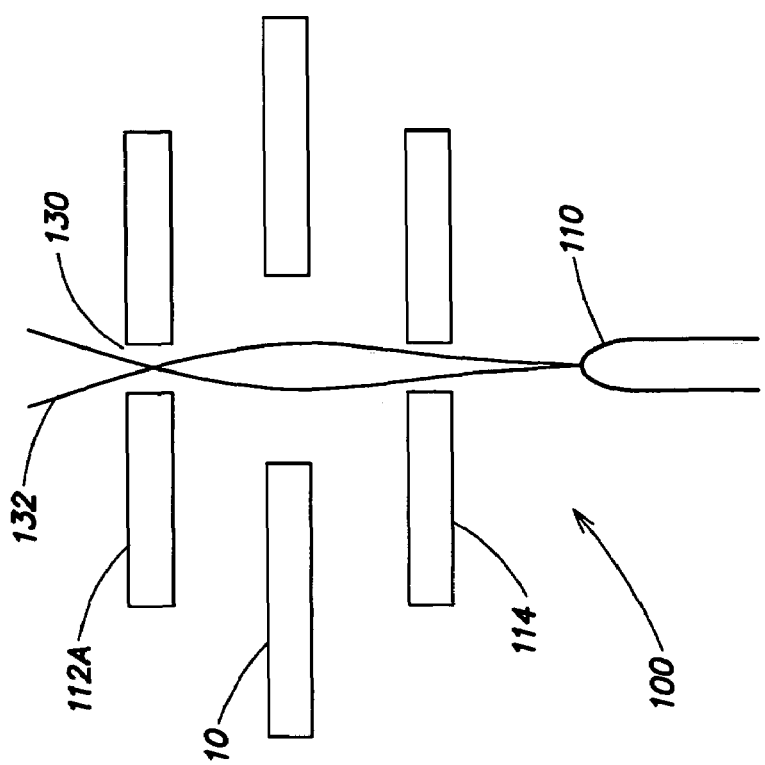
FIG. 2 is a schematic block diagram of an electron source in accordance with a second embodiment of the invention, shown in a cold operating mode.

A second embodiment of the invention is described with reference to FIGS. 2 and 3. The embodiment of FIGS. 2 and 3 is similar to the embodiment of FIG. 1 except that cathode 20 and filament 30 are not required, and electron source 100 generates electrons in both the cold and hot operating modes. In FIGS. 2 and 3, the basic components of electron source 100 are illustrated. An acceleration electrode 112A is configured as an annular cathode having an aperture 130 for passage of an electron beam 132.

In the cold operating mode illustrated in FIG. 2, focusing electrode 114 is biased to focus electron beam 132 so as to pass through aperture 130 in acceleration electrode 112A and into arc chamber 14 (FIG. 1). Acceleration electrode 112A may be fabricated of tungsten or other material having good electron emission in the cold operating mode. Electron beam 132 produces ionized molecules or ionized clusters in arc chamber 14 without generation of a plasma.

In the hot operating mode illustrated in FIG. 3, the electrons generated by filament 110 are defocused by focusing electrode 114 and thereby strike acceleration electrode 112A. The electrons produce heating of electrode 112A and emission of electrons into arc chamber 14. Thus, in the hot operating mode acceleration electrode 112A serves as an indirectly heated cathode.

In additional embodiments of the invention, an implanter architecture makes it convenient and practical to include more than one ion source on the implanter, where the two sources can be significantly different in design and operating principle. Cluster or molecular ion sources have been developed which improve low energy productivity, particularly for boron. However, an ion source which produces high output of molecular ions typically has poor production of conventional ion species, particularly multiply charged ions. The choice of a molecular ion source is basically a choice to make a dedicated low energy boron tool, which is unattractive in the market. These embodiments solve the problem of how to obtain the low energy productivity benefit of a molecular ion source while retaining the capability of high output of conventional species.

A third embodiment of the invention is described with reference to FIG. 4. The embodiment of FIG. 4 permits an implanter to switch between the outputs of two ion sources, using mainly elements that are already present in the beamline. The ion implanter includes a conventional atomic ion source. A molecular ion source is added to the implanter.

A molecular ion source is added to an ion implanter, such as the VIISta 810 manufactured and sold by Varian Semiconductor Equipment Associates, Inc. The molecular ion source is added in a position such that when in operation its output is directed along the axis of the acceleration column. In this case, the filter magnet is turned off. The filter magnet therefore allows selection between the two sources. When the filter magnet is on, the conventional source is selected and when the filter magnet is off the molecular ion source is selected. This is the preferred arrangement of the sources, as the low mass energy product of the filter magnet would limit the extraction voltage which can be applied to the molecular ion source.

Figure 4:
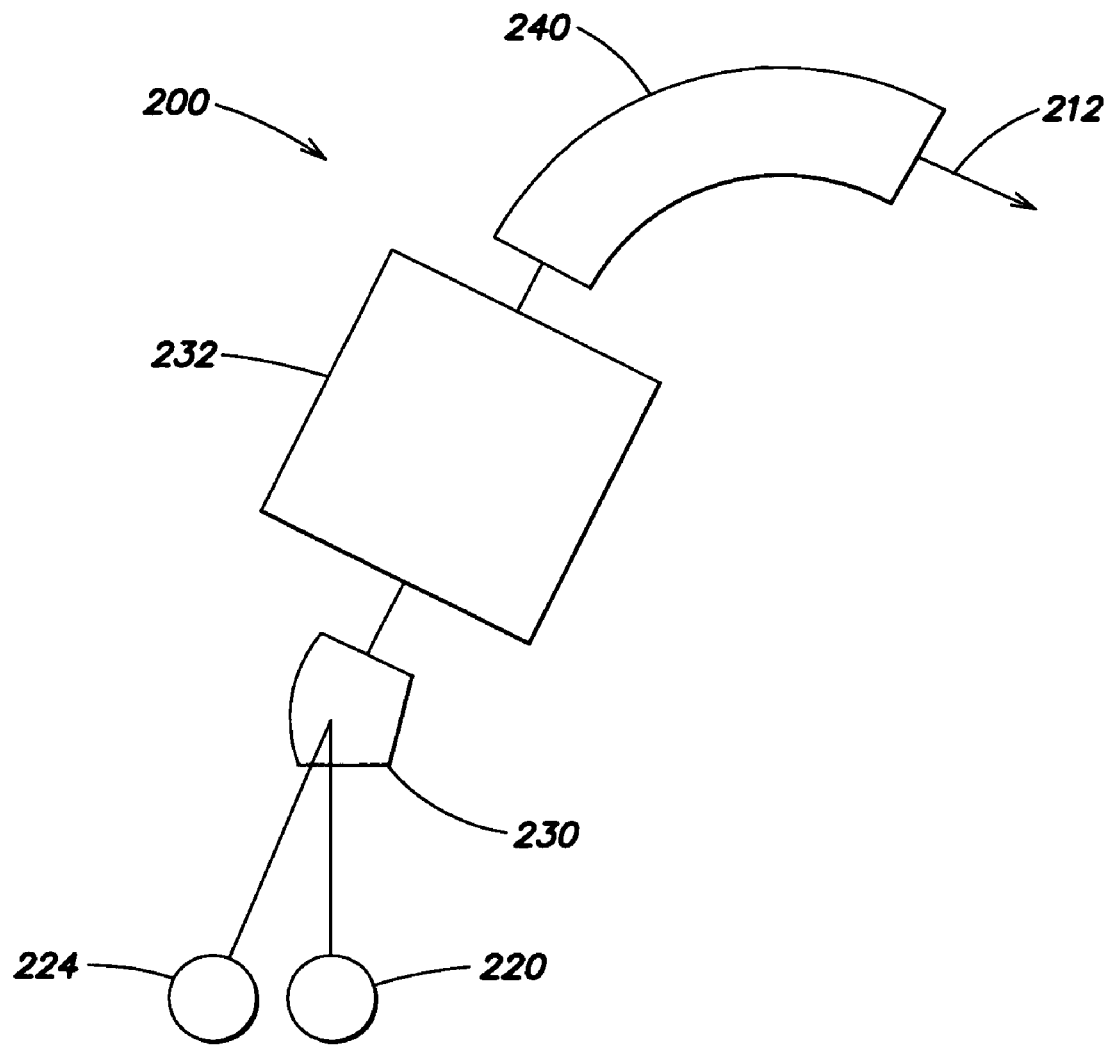
FIG. 4 is a schematic block diagram of an ion beam generator in accordance with a third embodiment of the invention.

Referring to FIG. 4, an ion beam generator 200 generates an ion beam of a desired species, accelerates ions in the ion beam to desired energies and performs mass/energy analysis of the ion beam to remove energy and mass contaminants and supplies an energetic ion beam 212 having low level of energy and mass contaminants. The principal components of ion beam generator 200 include a conventional or atomic ion source 220, a molecular ion source 224, a source filter 230, an acceleration/deceleration column 232 and a mass analyzer 240. Conventional ion source 220 is positioned along the input axis of source filter 230 with source filter 230 energized. Molecular ion source 224 is positioned along the axis of acceleration/deceleration column 232 with source filter 230 de-energized. Additional details regarding an ion beam generator having a single ion source are disclosed in U.S. Pat. No. 6,130,436 issued Oct. 10, 2000 Renau et al. The molecular ion source 224 may be of the type described in the aforementioned U.S. Pat. No. 6,452,338, for example.

A molecular ion source is not compatible with all the process gases that are used for ion implantation. One source architecture may not efficiently make an ion beam from standard implant gases as well as octadecaborane and other high molecular weight precursor gases. In a further embodiment, the system provides for switching the ion beams between two physically separate ion sources without moving the sources mechanically. In this embodiment, a filter magnet, or pre-analysis magnet, such as used in the VIISta 810 ion implanter is modified to accept a beam from the left and the right from two different ion sources. The source being utilized can be switched by reversing the magnetic field in the magnet. One source is a conventional or atomic ion source and the other source is a molecular ion source.

A fourth embodiment of the invention is described with reference to FIG. 5. A molecular ion source 300 and an atomic ion source 302 are mounted within a vacuum chamber 310. Molecular ion source 300 and atomic ion source 302 are positioned at opposite angles with respect to a beam axis 312. A filter magnet 320 is positioned downstream of molecular ion source 300 and atomic ion source 302 in vacuum chamber 310. A magnetic field produced by filter magnet 320 is reversible by reversing the polarity of the magnet current. A movable Faraday beam sensor 330 may be positioned at the output of molecular ion source 300, and a movable Faraday beam sensor 332 may be positioned at the output of atomic ion source 302. Beam sensors 330 and 332 are movable into and out of the path of the ion beams produced by ion sources 300 and 302, respectively. Filter magnet 320 outputs an ion beam 340, generated by source 300 or 302, to a beamline of an ion implanter.

Figure 5:
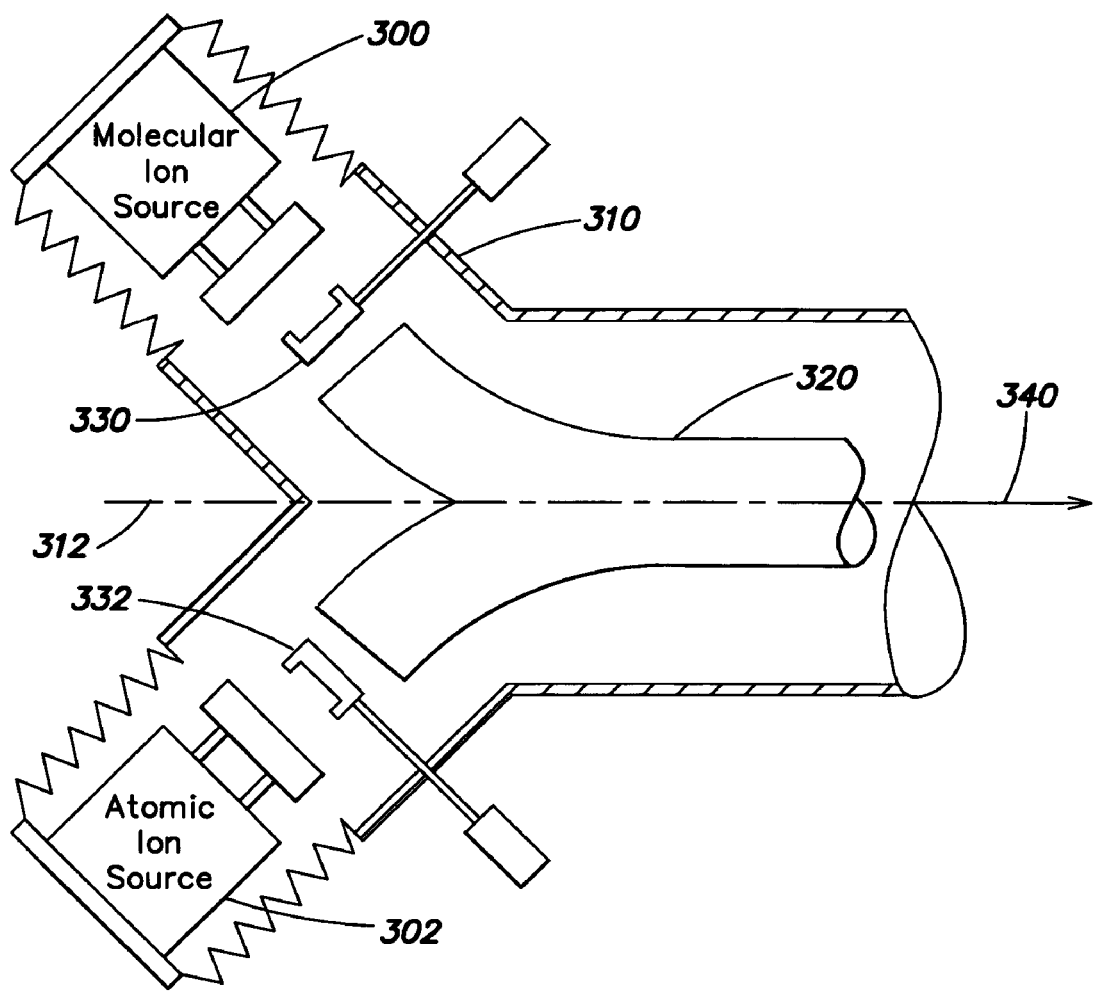
FIG. 5 is a schematic block diagram of an ion beam generator in accordance with a fourth embodiment of the invention.

When source 302 is to be used, the beam is tuned and then the filter magnet 320 is turned on with the magnetic field pointing up (perpendicular to the plane of FIG. 5). This causes the ion beam produced by source 302 to be deflected by filter magnet 320 and to be directed into the ion implanter. To switch to source 300, the magnetic field is reversed to pointing down and the ion beam from source 300 is directed into the ion implanter. Movable Faraday beam sensors 300 and 332 permit the tuned beam to remain on by blocking the unused source output. This arrangement enhances switching times.

Figure 6:
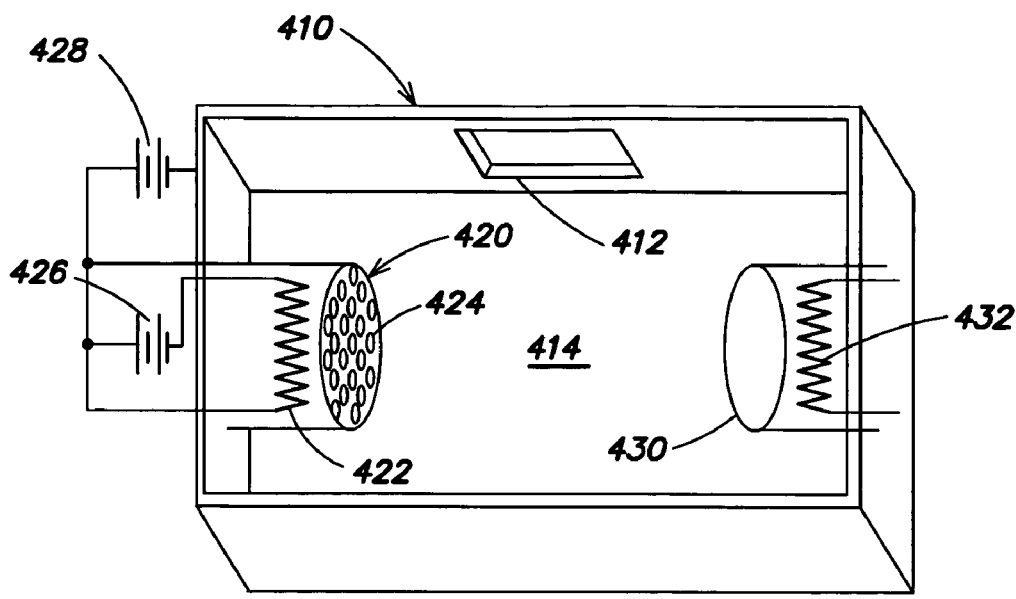
FIG. 6 is a schematic diagram of an ion source in accordance with a fifth embodiment of the invention, shown in a cold operating mode.
Figure 7:
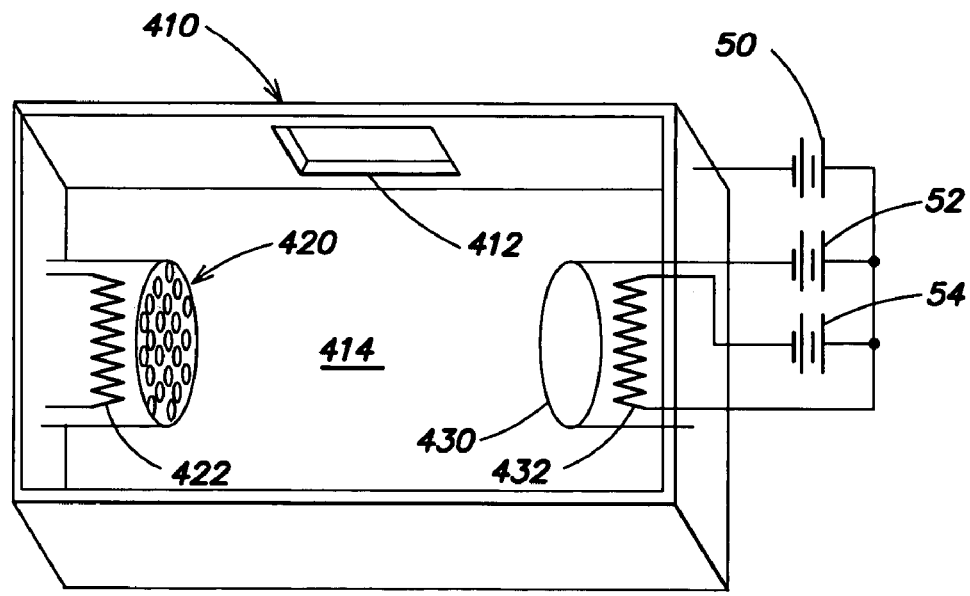
FIG. 7 is a schematic diagram of the ion source of FIG. 6, shown in a hot operating mode.

A fifth embodiment of the invention is described with reference to FIGS. 6 and 7. Operation in a cold operating mode as a molecular ion source is illustrated in FIG. 6. Operation in a hot operating mode as an atomic ion source is illustrated in FIG. 7.

Arc chamber housing 410 having an extraction aperture 412 defines an arc chamber 414. Different vaporizer/gas sources may be connected to arc chamber 414 for operation in the cold operating mode and the hot operating mode, as described above in connection with FIG. 1.

A cooled filament shield 420 and a filament 422 are positioned at one end of arc chamber 414. Filament shield 420 has multiple holes 424 to pass electrons from filament 422 into arc chamber 414. A filament power supply 426 has output terminals connected to filament 422. An arc power supply 428 has output terminals connected to arc chamber housing 410 and filament 422. An indirectly heated cathode 430 and a filament 432 are positioned at the opposite end of arc chamber 414. Power supplies 50, 52 and 54 correspond to power supplies 50, 52 and 54 shown in FIG. 1 and described above in connection with the hot operating mode.

In the cold operating mode illustrated in FIG. 6, filament 422 generates electrons which pass through holes 424 in cooled filament shield 420 and ionize a dopant material in arc chamber 414, thus producing molecular ions. In a cold operating mode, cathode 430 may be cooled and may serve as a repeller electrode. In the cold operating mode, filament 422 and filament shield 420 function as an electron source.

In the hot operating mode illustrated in FIG. 7, filament 432 generates electrons which heat cathode 430, causing generation of electrons within arc chamber 414 and ionization of the dopant material to produce atomic ions. In the hot operating mode, filament shield 420 may serve as a repeller electrode. In the hot operating mode, filament 432 and indirectly heated cathode 430 function as an electron source.

Some ion implanters utilize a ribbon ion beam for ion implantation. This technology is extendable to molecular sources using heavy gases such as octadecaborane. Modification of the arc chamber and ground electrodes permit a molecular ion source to extract a ribbon ion beam for use in ion implantation.

Current ribbon ion beam source technology dissociates molecular species and cannot form a high current molecular beam. A molecular ion source with appropriate arc chamber design permits extraction of a high molecular weight beam of sufficient current for ion implantation applications.

Having described several embodiments and an example of the invention in detail, various modifications and improvements will readily occur to those skilled in the art. Such modifications and improvements are intended to be within the spirit and the scope of the invention. Furthermore, those skilled in the art would readily appreciate that all parameters listed herein are meant to be exemplary and that actual parameters will depend upon the specific application for which the system of the present invention is used. Accordingly, the foregoing description is by way of example only and is not intended as limiting. The invention is limited only as defined by the following claims and their equivalents.

What is claimed is:

1. An ion source comprising:
   an arc chamber housing defining an arc chamber;
   a first dopant source configured to supply a first dopant material to the arc chamber in a first operating mode;
   a first electron source configured to ionize the first dopant material in the first operating mode;
   a second dopant source configured to supply a second dopant material to the arc chamber in a second operating mode; and
   a second electron source configured to ionize the second dopant material in the second operating mode, wherein the ion source supplies ions of the first dopant material in the first operating mode and supplies ions of the second dopant material in the second operating mode.

2. An ion source as defined in claim 1, wherein the first electron source is configured to ionize the first dopant material at relatively low temperature in the first operating mode and wherein the second electron source is configured to ionize the second dopant material at relatively high temperature in the second operating mode.

3. An ion source as defined in claim 2, wherein the first dopant source comprises a low temperature vaporizer.

4. An ion source as defined in claim 3, wherein the first dopant source is configured to supply molecules of the first dopant material to the arc chamber in the first operating mode.

5. An ion source as defined in claim 1, wherein the first electron source includes a filament located outside the arc chamber and an acceleration electrode for accelerating into the arc chamber electrons generated by the filament.

6. An ion source as defined in claim 3, wherein the second dopant source includes a gas supply.

7. An ion source as defined in claim 6, wherein the second electron source includes an indirectly heated cathode and a filament configured to heat the indirectly heated cathode.

8. An ion source as defined in claim 1, wherein the second electron source is configured as a beam dump for the first electron source in the first operating mode.

9. An ion source as defined in claim 8, wherein the second electron source is cooled in the first operating mode.

10. An ion source as defined in claim 1, wherein the first electron source is configured to repel electrons in the second operating mode.

11. An ion source as defined in claim 1, wherein the first and second electron sources are located at opposite ends of the arc chamber.

12. An ion source as defined in claim 7, further comprising a filament power supply for providing current for heating the filament, a bias power supply coupled between the filament and the cathode, and an arc power supply coupled between the cathode and the arc chamber housing.

13. An ion source as defined in claim 5, further comprising a filament power supply for providing current for heating the filament, and an acceleration power supply coupled between the acceleration electrode and the filament.

14. An ion source as defined in claim 1, wherein the first electron source includes a filament and a filament shield positioned between the filament and the arc chamber.

15. An ion source as defined in claim 14, wherein the filament shield includes a plurality of holes for passing electrons generated by the filament.

16. An ion source as defined in claim 14, wherein the second electron source includes an indirectly heated cathode and a filament configured to heat the indirectly heated cathode.

17. An ion source comprising:
    an arc chamber housing defining an arc chamber;
    a low temperature vaporizer configured to supply a first dopant material to the arc chamber in a cold operating mode;
    a first electron source configured to ionize the first dopant material in the cold operating mode;
    a gas supply configured to supply a second dopant material to the arc chamber in a hot operating mode; and
    a second electron source including an indirectly heated cathode positioned within the arc chamber and a filament for heating the cathode, wherein the second electron source is configured to ionize the second dopant material in the hot operating mode, wherein the ion source supplies ions of the first dopant material in the cold operating mode and supplies ions of the second dopant material in the hot operating mode.

18. A method for generating ions in an arc chamber, comprising:
    supplying a first dopant material to the arc chamber in a first operating mode;
    ionizing the first dopant material in the first operating mode using a first electron source;
    supplying a second dopant material to the arc chamber in a second operating mode; and ionizing the second dopant material in the second operating mode using a second electron source, wherein the ion source supplies ions of the first dopant material in the first operating mode and supplies ions of the second dopant material in the second operating mode.

19. A method as defined in claim 18, further comprising biasing the second electron source as an electron beam dump in the first operating mode.

20. A method as defined in claim 19, further comprising cooling the second electron source in the first operating mode.

21. A method as defined in claim 18, further comprising biasing the first electron source to repel electrons in the second operating mode.

22. A method as defined in claim 18, further comprising maintaining the arc chamber at relatively low temperature in the first operating mode and maintaining the arc chamber at relatively high temperature in the second operating mode.

23. A method as defined in claim 18, wherein ionizing the first dopant material comprises generating molecular ions at a relatively low temperatures.

24. A method as defined in claim 23, wherein ionizing the second dopant material comprises generating atomic ions at relatively high temperatures.

25. An ion source comprising:
an arc chamber housing defining an arc chamber;
a first dopant source configured to supply a first dopant material to the arc chamber in a first operating mode;
a second dopant source configured to supply a second dopant material to the arc chamber in a second operating mode; and
an electron source including a cathode positioned in the arc chamber, a filament configured to generate electrons when energized with an electrical current and a control element configured to direct the electrons into the arc chamber in the first operating mode and to direct the electrons to the cathode for heating thereof in the second operating mode.

26. An ion source as defined in claim 25, wherein the electron source is configured to ionize the first dopant material at relatively low temperature in the first operating mode and wherein the electron source is configured to ionize the second dopant material at relatively high temperature in the second operating mode.

27. An ion source as defined in claim 25, wherein the first dopant source comprises a low temperature vaporizer.

28. An ion source as defined in claim 27, wherein the first dopant source is configured to supply in molecules of the first dopant material to the arc chamber in the first operating mode.

29. An ion source as defined in claim 25, wherein the electron source includes a filament located outside the arc chamber and an acceleration electrode to accelerate into the arc chamber the electrons generated by the filament.

30. An ion source as defined in claim 25, wherein the cathode includes an aperture and wherein the electron source further comprises a focusing electrode to direct the electrons through the aperture in the cathode into the arc chamber in the first operating mode.

31. A method for generating ions in an arc chamber, comprising:
supplying a first dopant material to the arc chamber in a first operating mode;
supplying a second dopant material to the arc chamber in a second operating mode;
ionizing the first dopant material in the first operating mode by directing electrons into the arc chamber; and
ionizing the second dopant material in the second operating mode by directing the electrons to a cathode positioned in the arc chamber, for heating of the cathode.

32. A method as defined in claim 31, wherein ionizing the first dopant material comprises generating molecular ions at relatively low temperature and wherein ionizing the second dopant material comprises generating atomic ions at relatively high temperature.

33. An ion beam generator comprising:
a molecular ion source configured to generate molecular ions in a first operating mode;
an atomic ion source configured to generate atomic ions in a second operating mode; and
a switching element configured to direct molecular ions from the molecular ion source along a beamline in the first operating mode and configured to direct atomic ions from the atomic ion source along the beamline in the second operating mode.

34. An ion beam generator as defined in claim 33, wherein the molecular ion source operates at relatively low temperature and wherein the atomic ion source operates at relatively high temperature.

35. An ion beam generator as defined in claim 33, wherein the switching element comprises a switchable magnet.

36. An ion beam generator as defined in claim 33, further comprising first and second blocking elements for selectably blocking outputs of the molecular ion source and the atomic ion source, respectively.

* * * * *